United States Patent
Yano et al.

(10) Patent No.: US 11,683,917 B2
(45) Date of Patent: Jun. 20, 2023

(54) VEHICLE CONTROL DEVICE

(71) Applicant: Mitsubishi Electric Corporation, Tokyo (JP)

(72) Inventors: Kentaro Yano, Tokyo (JP); Morito Oh, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 194 days.

(21) Appl. No.: 16/345,486

(22) PCT Filed: Jan. 17, 2017

(86) PCT No.: PCT/JP2017/001348
§ 371 (c)(1),
(2) Date: Apr. 26, 2019

(87) PCT Pub. No.: WO2018/134869
PCT Pub. Date: Jul. 26, 2018

(65) Prior Publication Data
US 2020/0187389 A1 Jun. 11, 2020

(51) Int. Cl.
*H05K 7/20* (2006.01)

(52) U.S. Cl.
CPC ......... *H05K 7/20863* (2013.01); *H05K 7/202* (2013.01); *H05K 7/20145* (2013.01); *H05K 7/20181* (2013.01)

(58) Field of Classification Search
CPC ........... H05K 7/20863; H05K 7/20145; H05K 7/20181; H05K 7/20918
See application file for complete search history.

(56) References Cited

U.S. PATENT DOCUMENTS

| | | | |
|---|---|---|---|
| 2,927,250 A * | 3/1960 | Scharli | 165/185 |
| 6,422,395 B1 * | 7/2002 | Verdegan | B01D 29/21 210/411 |

(Continued)

FOREIGN PATENT DOCUMENTS

| | | |
|---|---|---|
| JP | H02057466 A | 2/1990 |
| JP | H11152033 A | 6/1999 |

(Continued)

OTHER PUBLICATIONS

International Search Report (PCT/ISA/210) and Written Opinion (PCT/ISA/237) dated Feb. 21, 2017, by the Japan Patent Office as the International Searching Authority for International Application No. PCT/JP2017/001348.

(Continued)

*Primary Examiner* — Leonard R Leo
(74) *Attorney, Agent, or Firm* — Buchanan Ingersoll & Rooney PC (57) ABSTRACT

In a housing of a vehicle control device are formed a suction port for taking outdoor air and a discharge port for discharging air taken in through the suction port. A flow passage that connects the suction port and the discharge port is formed inside the housing. A blocking member, a radiator, and a blower are provided in the flow passage. The blocking member is provided at a position where the blocking member faces at least a portion of an opening face of the suction port in the flow passage and a distance between the blocking member and the suction port is in a predetermined range.

12 Claims, 5 Drawing Sheets

(56) References Cited

U.S. PATENT DOCUMENTS

| | | | | |
|---|---|---|---|---|
| 6,877,551 | B2* | 4/2005 | Stoller | H05K 7/206 |
| | | | | 165/122 |
| 6,889,752 | B2* | 5/2005 | Stoller | H05K 7/206 |
| | | | | 165/122 |
| 6,940,716 | B1* | 9/2005 | Korinsky | H01L 23/467 |
| | | | | 361/697 |
| 7,455,706 | B2* | 11/2008 | Latham | B01D 46/0086 |
| | | | | 55/385.1 |
| 8,462,505 | B2* | 6/2013 | Nagami | B23K 9/1006 |
| | | | | 361/697 |
| 8,508,939 | B2* | 8/2013 | Takahasi | F04D 25/0613 |
| | | | | 361/695 |
| 2010/0212506 | A1 | 8/2010 | Yamaga et al. | |
| 2014/0262194 | A1* | 9/2014 | Hernon et al. | F28F 3/02 |
| | | | | 165/185 |
| 2016/0144311 | A1 | 5/2016 | Suzuki | |
| 2017/0263985 | A1 | 9/2017 | Nishikawa et al. | |

FOREIGN PATENT DOCUMENTS

| | | |
|---|---|---|
| JP | 2000016288 A | 1/2000 |
| JP | 2004051037 A | 2/2004 |
| JP | 2004225962 A | 8/2004 |
| JP | 2006050742 A | 2/2006 |
| JP | 2006347309 A | 12/2006 |
| JP | 2010149564 A | 7/2010 |
| JP | 2016062705 A | 4/2016 |
| JP | 2016098774 A | 5/2016 |
| WO | 2009041257 A1 | 4/2009 |

OTHER PUBLICATIONS

Office Action dated Apr. 23, 2019, by the Japan Patent Office for Application No. 2018-562746.

Office Action dated Jul. 23, 2019, issued in corresponding Japan Patent Application No. 2018-562746, 6 pages including 3 pages of English translation.

* cited by examiner

VEHICLE CONTROL DEVICE

TECHNICAL FIELD

The present disclosure relates to a vehicle control device that includes a suction port provided with a filter.

BACKGROUND ART

A control device mounted on a railroad vehicle is provided with a blower, and air outside a housing is drawn via a suction port into the housing by the blower. The air drawn into the housing passes through a radiator and the blower and is discharged from a discharge port. The radiator emits heat that is caused by an electronic component connected to the radiator, thereby suppressing a rise in temperature of the electronic component. The suction port is provided with a filter to prevent foreign substances such as pollen and dust from entering the housing of the control device.

Patent Literature 1 discloses that equipment placed under a floor is covered with a cowling cover with an air filter, and that the cowling cover has a curved surface shape and is integrated with a vehicle body.

CITATION LIST

Patent Literature

Patent Literature 1: Unexamined Japanese Patent Application Kokai Publication No. 2000-016288

SUMMARY OF INVENTION

Technical Problem

Pollen, dust and the like attach to the filter provided at the suction port of the control device mounted on the railroad vehicle, and thus filter clogging occurs as time proceeds. The filter clogging causes a decrease in an amount of the outdoor air drawn into the housing, thereby causing a decrease in cooling efficiency. Accordingly, the above control device requires periodic maintenance such as cleaning of the filter, replacement of the filter and the like. A cycle of maintenance of the filter is to be extended from the viewpoint of cost saving.

In order to solve the aforementioned problem, an objective of the present disclosure is to extend a cycle of maintenance of the filter provided at the suction port of the vehicle control device.

Solution to Problem

In order to achieve the aforementioned objective, a vehicle control device of the present disclosure includes a housing to be mounted on a vehicle, a filter, a flow passage, a blower, a blocking member, an electronic component, and a radiator. The housing has (i) a suction port through which outdoor air is taken in along a width direction of the vehicle or a direction of movement of the vehicle and (ii) a discharge port from which the air taken in through the suction port is discharged. The filter is disposed at the suction port. The air taken in through the suction port passes through the flow passage and is discharged from the discharge port. The blower is provided in the flow passage. The blocking member is a one-piece plate-shaped member and is placed, in the flow passage, at a position at which the blocking member faces a whole of an opening face of the suction port and a distance between the blocking member and the suction port is in a predetermined range. The electronic component is accommodated within the housing and is located exterior to the flow passage. The radiator is connected to the electronic component and emits, from a portion of the radiator exposed to the flow passage, heat generated by the electronic component. The air taken in through the suction port flows toward the blocking member, thereafter flows along the blocking member, passes through the radiator and the blower, and is discharged from the discharge port.

Advantageous Effects of Invention

According to the present disclosure, the blocking member is placed at the position at which the blocking member faces at least a portion of the opening face of the suction port and at which the distance between the blocking member and the suction port is in the predetermined range, whereby at least the portion of the air taken in through the suction port flows toward the blocking member, thereafter flows along the blocking member, passes through the radiator and the blower, and is discharged from the discharge port, thereby making enabling extension of the cycle of maintenance of the filter provided for the suction port of the vehicle control device.

DESCRIPTION OF EMBODIMENTS

Figure 1:
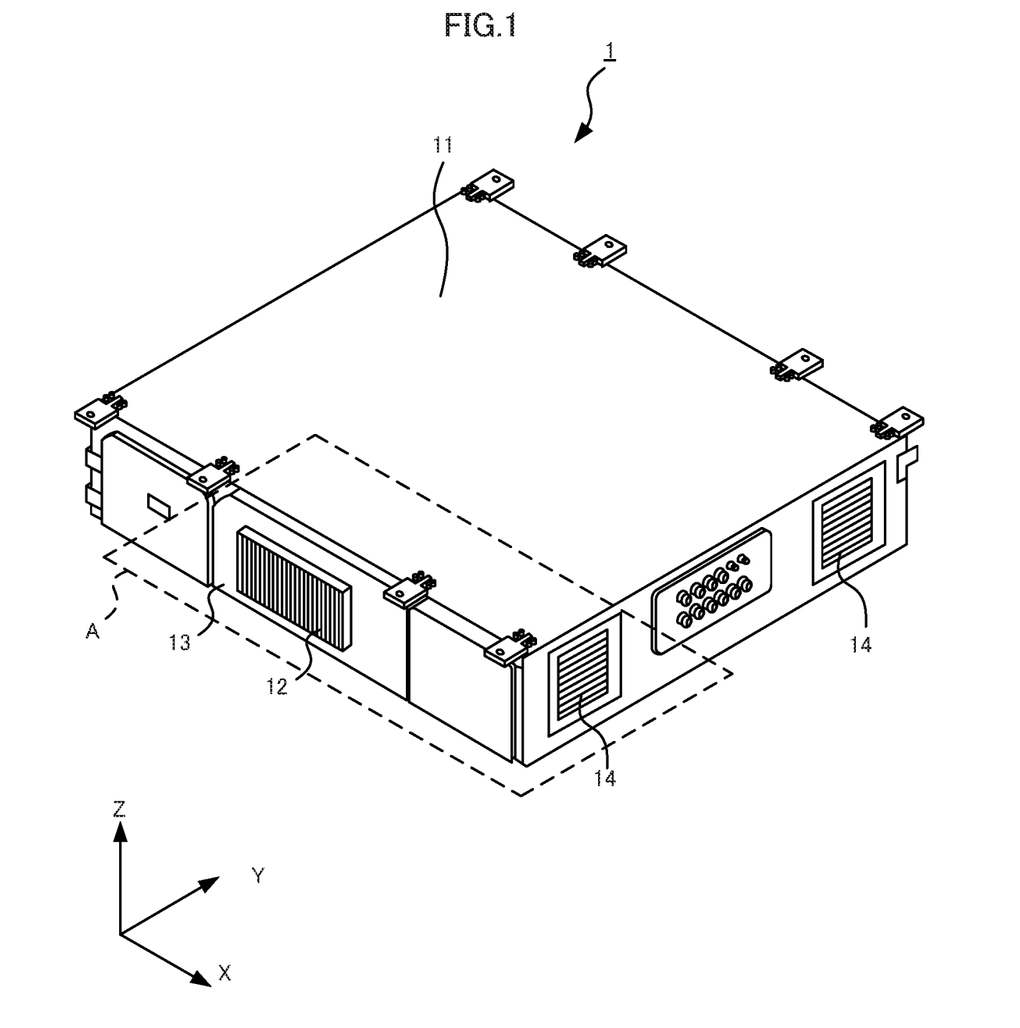
FIG. 1 is a perspective view of a vehicle control device according to an embodiment of the present disclosure.
Figure 2:
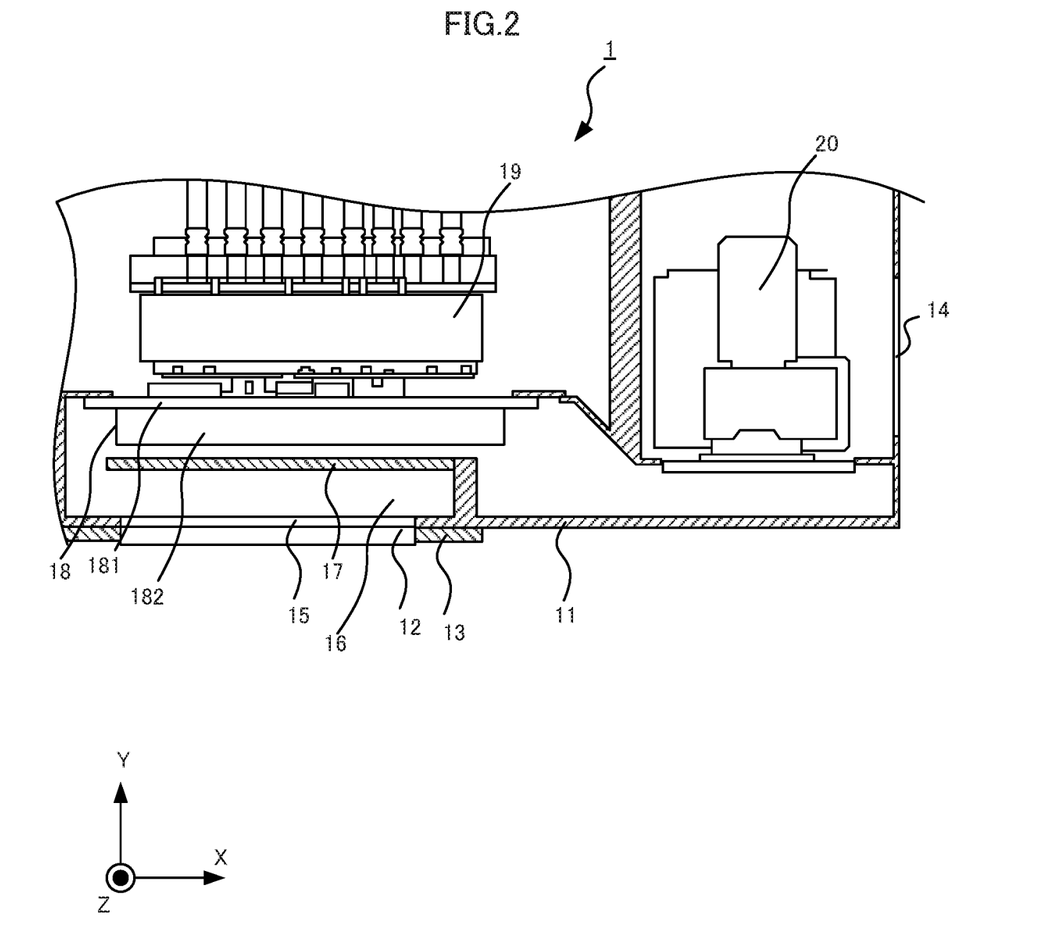
FIG. 2 is a cross-sectional view of the vehicle control device according to the embodiment.

Embodiments of the present disclosure are described in detail hereinafter with reference to the drawings. Components that are the same or equivalent are assigned the same reference signs throughout the drawings FIG. 1 is a perspective view of a vehicle control device according to an embodiment of the present disclosure. In FIG. 1, Z-axis denotes the vertical direction, X-axis denotes a direction of movement of a vehicle on which a vehicle control device 1 is mounted, and Y-axis denotes width direction of the vehicle on which the vehicle control device 1 is mounted. The vehicle control device 1 is mounted on, for example, an electric railroad vehicle. A housing 11 of the vehicle control device 1 is placed under a floor or on a roof of the vehicle. FIG. 2 is a cross-sectional view of the vehicle control device according to the embodiment. FIG. 2 is a cross-sectional view of a range "A" of FIG. 1 in the X-Y plane, that is, a cross-sectional view taken along the horizontal direction. The housing 11 of the vehicle control device 1 is provided with (i) a suction port 15 through which outdoor air flows in and (ii) a discharge port 14 from which the air taken in through the suction port 15 is discharged. In an example illustrated in FIGS. 1 and 2, opening faces of the suction port 15 and the discharge port 14 are perpendicular to the horizontal direction. Also, in the example illustrated in FIGS. 1 and 2, the suction port 15 is formed in a face of the housing 11 perpendicular to the Y-axis direction, and the discharge port 14 is formed in a face of the housing 11 perpendicular to the X-axis direction. Neither the opening face of the suction port 15 nor the opening face of the discharge port 14 is necessarily to be perpendicular to the horizontal direction. The suction port 15 may be placed at any position at which the outdoor air flows in along the width direction of the vehicle or the direction of movement of the vehicle. For example, the suction port 15 may be provided on the face of the housing 11 perpendicular to the X-axis direction.

The vehicle control device 1 includes a flow passage 16 through which the air taken in through the suction port 15 passes until the air is discharged from the discharge port 14. In the example illustrated in FIG. 1, two discharge ports 14 are formed in the same face of the housing 11 perpendicular to the X-axis direction. A suction port 15 may be formed in each of two faces of the housing 11 perpendicular to the Y-axis direction, and the flow passage 16 may be formed such that one of the two suction ports 15 communicates with one of the two discharge ports 14 and the other of the two suction ports 15 communicates with the other of the two discharge ports 14 via the through passage 16. Positions at which the suction ports 15 and the discharge port 14 are formed are not limited to those in the above example.

The suction port 15 is provided with a filter 12. In the example illustrated in FIGS. 1 and 2, the filter 12 is attached to a cover 13 covering an area surrounding the suction port 15. The attachment of the filter 12 integrally to the cover 13 enables removing the filter 12 together with the cover 13 when the cover 13 is removed during maintenance of the vehicle control device 1, thereby improving the efficiency of maintenance work.

The flow passage 16 is provided with a blocking member 17, a radiator 18 and a blower 20. The blower 20 is a fan or a low pressure compressor. An electronic component 19 is accommodated in the housing 11 such that the electronic component 19 is located on the outside of the flow passage 16. The blocking member 17 blocks a portion of the air flowing through the flow passage 16. The blocking member 17 is placed, in the flow passage 16, at a position at which the blocking member 17 faces at least a portion of an opening face of the suction port 15 and at which a distance between the blocking member 17 and the suction port 15 is in a predetermined range. The predetermined range can be freely selected in accordance with an amount of airflow per unit time necessary for cooling of the electronic component 19, a desired cycle of maintenance of the filter 12, or the like. For example, the predetermined range may be a range from 50 millimeters to 300 millimeters.

By the arrangement of the blocking member 17, at least a portion of the air taken in through the suction port 15 flows along the blocking member 17 after flowing toward the blocking member 17, passes through the radiator 18 and the blower 20, and then is discharged from the discharge port 14. Since at least the portion of the air taken in through the suction port 15 flows toward the blocking member 17 and then flows along the blocking member 17, an air flow velocity at the suction port 15 is lower than that in a case in which the blocking member 17 is not used. Decrease in the airflow velocity at the suction port 15 results in decrease in a flow rate that is a volume of air taken in through the suction port 15 per unit time. As a result, an amount of foreign substances attached to the filter 12, such as pollen and dust, can be reduced, thereby enabling an extension of the cycle of maintenance of the filter 12. The placement of the blocking member 17 closer to the suction port 15 enables a further decrease in the air flow velocity at the suction port 15. The airflow velocity at the suction port 15 is, for example, the average value of airflow velocities at positions on the opening face of the suction port 15.

The radiator 18 includes a base portion 181 and fins 182. The base portion 181 is connected to the electronic component 19. The base portion 181 is a component separating the flow passage 16 from the outside of the flow passage 16 at which the electronic component 19 is placed, that is, an area into which the outdoor air does not flow. The radiator 18 emits, from the fins 182 exposed to the flow passage 16, heat transmitted from the electronic component 19 through the base portion 181. The shape of the radiator 18 is not limited to that in the above example. The air taken in through the suction port 15 passes between the fins 182 and through the blower 20 and then is discharged from the discharge port 14. Heat generated by the electronic component 19 is transmitted to the air passing between the fins 182, thereby suppressing a rise in temperature of the electronic component 19.

The blocking member 17 is, for example, a plate-shaped member that faces the whole of the opening face of the suction port 15. By the configuration in which the blocking member 17 faces the whole of the opening face of the suction port 15, the air taken in through the suction port 15 flows along the blocking member 17 after flowing toward the blocking member 17, passes through the radiator 18 and the blower 20, and then is discharged from the discharge port 14.

Figure 3:
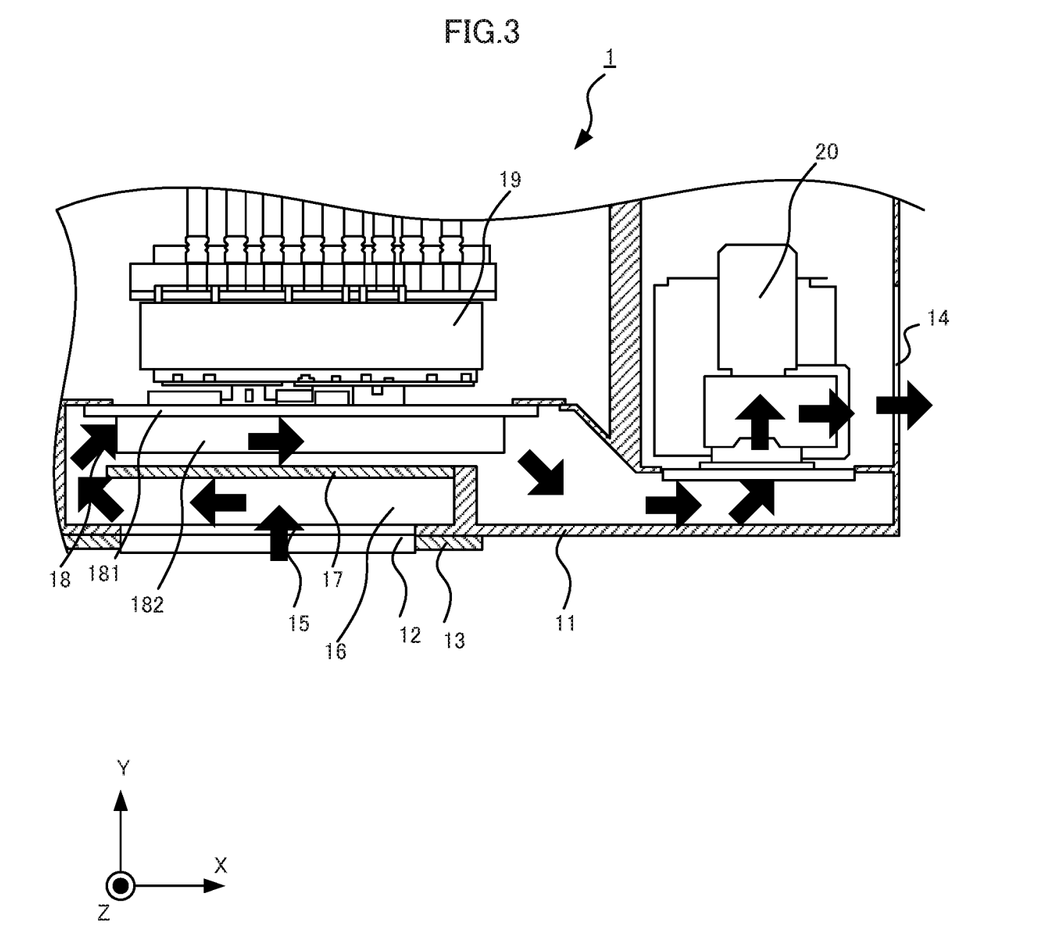
FIG. 3 is a view of a flow of air in the vehicle control device according to the embodiment.

FIG. 3 is a view of a flow of air in the vehicle control device according to the embodiment. In FIG. 3, the flow of air is represented by black arrows. The blocking member 17 is the plate-shaped member that faces the whole of the opening face of the suction port 15, and an end portion of the blocking member 17 close to the discharge port 14 may be fixed to an inner wall of the flow passage 16. In this case, the air taken in through the suction port 15 flows toward the blocking member 17, thereafter flows along the blocking member 17 such that the air flows away from the discharge port 14, turns in the opposite direction, passes through the radiator 18 and the blower 20, and then is discharged from the discharge port 14.

Figure 4:
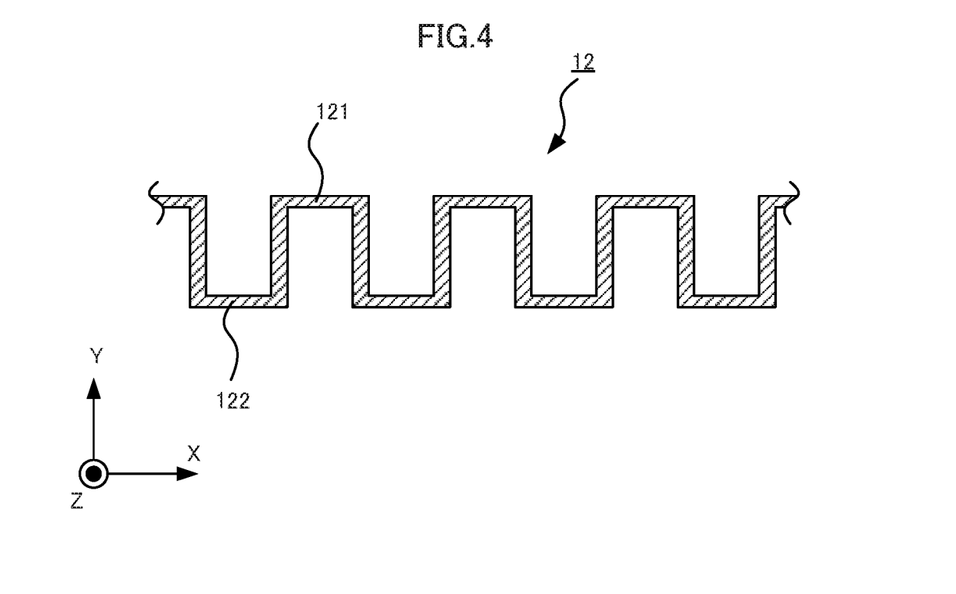
FIG. 4 is a cross-sectional view of a filter according to the embodiment.

FIG. 4 is a cross-sectional view of the filter according to the embodiment. The filter 12 is formed, for example, by bending a metal and is provided with non-illustrated through holes that are formed at fixed intervals. In the example illustrated in FIG. 4, the shape of the cross section of the filter 12 taken along the horizontal direction is a corrugated shape formed by an alternating sequence of rectangle-shaped concave portions 121 and rectangle-shaped convex portions 122. The outdoor air flows in through the suction port 15 in the positive direction of the Y-axis, passes through the filter 12, and then flows into the flow passage 16. The concave portions 121 are depressed in the direction in which the air flows in through the suction port 15, that is, in the positive direction of the Y-axis. The convex portions 122 protrude in the direction opposite to the direction in which the air flows in through the suction port 15, that is, in the negative direction of the Y-axis.

Figure 5:
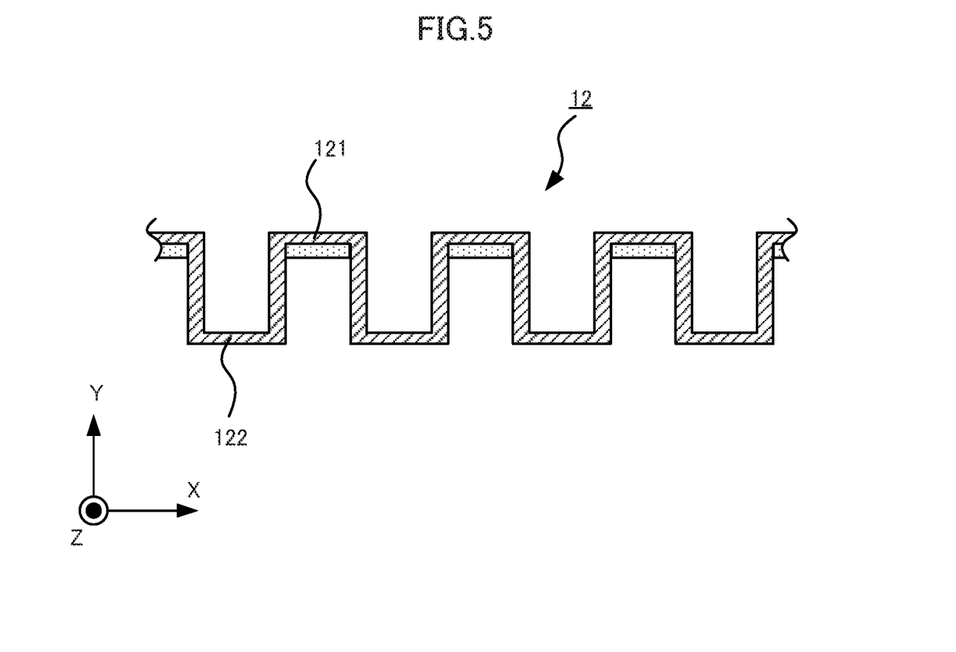
FIG. 5 is a view of an example of substances attached to the filter according to the embodiment.

FIG. 5 is a view of an example of substances attached to the filter according to the embodiment. In FIG. 5, the substances attached to the filter are represented by areas filled with dots. As illustrated in FIG. 5, by the corrugated shape of the cross section of the filter 12 taken along the horizontal direction, the foreign substances such as pollen and dust mainly attach to portions of the concave portions 121 parallel to the X axis and do not attach to faces of the convex portions 122 and the concave portion 121 perpendicular to the X-axis direction. That is, the air can pass through through holes formed on the portions of the concave portions 121 perpendicular to the X axis and through holes formed on the convex portions 122. By the structure in which the cross section of the filter 12 taken along the horizontal direction has the corrugated shape formed by the sequence of the rectangle-shaped concave portions 121 and the rectangle-shaped convex portions 122, the attachment of the foreign substances such as pollen and dust to a portion of the filter 12 can be suppressed, and thus clogging of the filter 12 can be suppressed.

Figure 6:
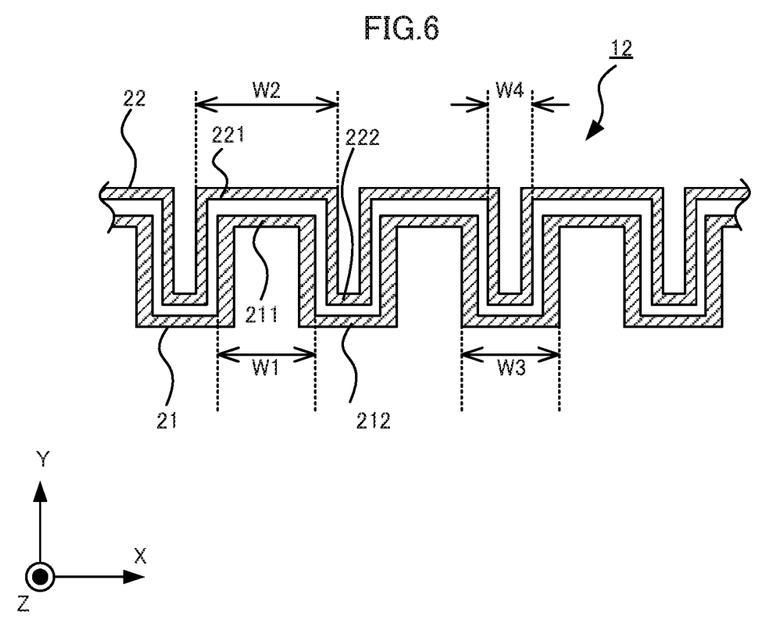
FIG. 6 is a cross-sectional view of the filter according to the embodiment.

FIG. 6 is a cross-sectional view of the filter according to the embodiment. In the example illustrated in FIG. 6, the filter 12 includes a first filter 21 and a second filter 22. The second filter 22 is placed nearer to the inside of the flow passage 16 than the first filter 21. Since a mesh of the second filter 22 is finer than that of the first filter 21, the foreign substances having passed through the first filter 21, which are pollen, dust and the like, can be removed by the second filter 22. The use of the second filter 22 having the mesh finer than that of the first filter 21 enables removal of foreign substances such as finer pollen and dust.

In the example illustrated in FIG. 6, the shape of the cross section of the first filter 21 taken along the horizontal direction is a corrugated shape formed by a sequence of rectangle-shaped concave portions 211 and rectangle-shaped convex portions 212. Also, the shape of the cross section of the second filter 22 taken along the horizontal direction is a corrugated shape formed by a sequence of rectangle-shaped concave portions 221 and rectangle-shaped convex portions 222. As in the case with the concave portions 121, the concave portions 211 and the concave portions 221 are depressed in the direction in which the air flows in, that is, in the positive direction of the Y-axis. As in the case with the convex portions 122, the convex portions 212 and the convex portions 222 protrude in the direction opposite to the direction in which the air flows in, that is, in the negative direction of the Y-axis.

In the cross section taken along the horizontal direction, the lengths W1 of the concave portions 211 of the first filter 21 in the width direction, that is, in the X-axis direction, are shorter than the lengths W2 of the concave portions 221 of the second filter 22 in the width direction. In the cross section taken along the horizontal direction, the lengths W3 of the convex portions 212 of the first filter 21 in the width direction are longer than the lengths W4 of the convex portions 222 of the second filter 22 in the width direction. Also, in the example illustrated in FIG. 6, a distance between the first filter 21 and the second filter 22 in the Y-axis direction is shorter than the width of the first filter 21 in the Y-axis direction.

As described above, in the vehicle control device 1 according to the present embodiment, the blocking member 17 is placed at the position at which the blocking member 17 faces at least a portion of the opening face of the suction port 15 and at which a distance between the blocking member 17 and the suction port 15 is in the predetermined range, and at least a portion of air taken in through the suction port 15 flows along the blocking member 17 after flowing toward the blocking member 17, passes through the radiator 18 and the blower 20, and is discharged from the discharge port 14, thereby enabling extension of the cycle of maintenance of the filter 12 attached to the suction port 15 of the vehicle control device 1.

The present disclosure is not limited to the above embodiment. The blocking member 17 may have any shape for decrease in a flow velocity at the suction port 15. Also, the flow passage 16 may have any shape.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Vehicle control device
11 Housing
12 Filter
13 Cover
14 Discharge port
15 Suction port
16 Flow passage
17 Blocking member
18 Radiator
19 Electronic component
20 Blower
21 First filter
22 Second filter
181 Base portion
182 Fin
121, 211, 221 Concave portion
122, 212, 222 Convex portion

The invention claimed is:

1. A vehicle control device comprising:
a housing to be mounted on a vehicle, the housing having (i) a suction port through which outdoor air is taken in along a first direction being one of a width direction of the vehicle or a direction of movement of the vehicle and (ii) a discharge port from which the air taken in through the suction port is discharged;
a filter to be disposed at the suction port;
a flow passage through which the air taken in through the suction port is to pass until the air is discharged from the discharge port;
a blower disposed in the flow passage;
a blocking member that is a one-piece plate-shaped member, the blocking member being disposed, in the flow passage, at a position at which the blocking member faces a whole of an opening face of the suction port and a distance between the blocking member and the suction port is in a predetermined range;
an electronic component accommodated within the housing and disposed exterior to the flow passage; and
a radiator connected to the electronic component, to emit, from a portion of the radiator exposed to the flow passage, heat generated by the electronic component,
wherein
an end portion of the blocking member close to the discharge port is fixed to an inner wall of the flow passage, and
the air taken in through the suction port flows toward the blocking member, thereafter flows along the blocking member in a second direction away from the discharge port, flows between another end portion of the blocking member and the inner wall of the flow passage, turns in a third direction opposite to the second direction away from the discharge port, passes through the radiator, after having passed through the radiator is deflected and enters through the blower in the first direction in which the air flows in through the suction port and is discharged from the discharge port in the third direction.

2. The vehicle control device according to claim 1, wherein
the suction port is formed on a face of the housing perpendicular to the width direction of the vehicle,
the discharge port is formed on a face of the housing perpendicular to the direction of movement of the vehicle,
the radiator comprises fins that extend in the direction of movement of the vehicle and are spaced in a vertical direction, and
the blower sucks, along the width direction of the vehicle, the air taken in through the suction port, and thereafter discharges the air along the direction of movement of the vehicle.

3. The vehicle control device according to claim 2, wherein
the radiator is disposed at a position at which the radiator faces a first face of the blocking member opposite to a second face of the blocking member that faces the opening face.

4. The vehicle control device according to claim 2, wherein
the blower is disposed such that the blower is nearer to the discharge port than the radiator is.

5. The vehicle control device according to claim 2, wherein
a shape of a cross section of the filter taken along a horizontal direction is a corrugated shape formed by an alternating sequence of rectangle-shaped concave portions and rectangle-shaped convex portions.

6. The vehicle control device according to claim 2, wherein
the filter comprises:
a first filter; and
a second filter placed nearer to an interior of the flow passage than the first filter and having a mesh size that is finer than a mesh size of the first filter.

7. The vehicle control device according to claim 6, wherein
a shape of a cross section of the first filter and a shape of a cross section of the second filter taken along a horizontal direction are each a corrugated shape formed by an alternating sequence of rectangle-shaped concave portions and rectangle-shaped convex portions,
in the cross sections taken along the horizontal direction, a length of each of the concave portions of the first filter in a width direction is shorter than a length of each of the concave portions of the second filter in the width direction, and a length of each of the convex portions of the first filter in the width direction is longer than a length of each of the convex portions of the second filter in the width direction, and
a distance between the first filter and the second filter in a direction perpendicular to the opening face of the suction port is shorter than a width of the first filter in the direction perpendicular to the opening face of the suction port.

8. The vehicle control device according to claim 1, wherein
the radiator is disposed at a position at which the radiator faces a first face of the blocking member opposite to a second face of the blocking member that faces the opening face.

9. The vehicle control device according to claim 1, wherein
the blower is disposed such that the blower is nearer to the discharge port than the radiator is.

10. The vehicle control device according to claim 1, wherein
a shape of a cross section of the filter taken along a horizontal direction is a corrugated shape formed by an alternating sequence of rectangle-shaped concave portions and rectangle-shaped convex portions.

11. The vehicle control device according to claim 1, wherein
the filter comprises:
a first filter; and
a second filter placed nearer to an interior of the flow passage than the first filter and having a mesh size that is finer than a mesh size of the first filter.

12. The vehicle control device according to claim 11, wherein
a shape of a cross section of the first filter and a shape of a cross section of the second filter taken along a horizontal direction are each a corrugated shape formed by an alternating sequence of rectangle-shaped concave portions and rectangle-shaped convex portions,
in the cross sections taken along the horizontal direction, a length of each of the concave portions of the first filter in a width direction is shorter than a length of each of the concave portions of the second filter in the width direction, and a length of each of the convex portions of the first filter in the width direction is longer than a length of each of the convex portions of the second filter in the width direction, and
a distance between the first filter and the second filter in a direction perpendicular to the opening face of the suction port is shorter than a width of the first filter in the direction perpendicular to the opening face of the suction port.

* * * * *